United States Patent
Jung et al.

(10) Patent No.: US 6,984,482 B2
(45) Date of Patent: Jan. 10, 2006

(54) TOP-COATING COMPOSITION FOR PHOTORESIST AND PROCESS FOR FORMING FINE PATTERN USING THE SAME

(75) Inventors: Jae Chang Jung, Ichon-shi (KR); Keun Kyu Kong, Kwangju (KR); Hyeong Soo Kim, Ichon-shi (KR); Jin Soo Kim, Taejon-shi (KR); Cha Won Koh, Seoul (KR); Sung Eun Hong, Sungnam-shi (KR); Geun Su Lee, Ichon-shi (KR); Min Ho Jung, Ichon-shi (KR); Ki Ho Baik, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 279 days.

(21) Appl. No.: 10/174,497

(22) Filed: Jun. 17, 2002

(65) Prior Publication Data

US 2003/0108815 A1 Jun. 12, 2003

Related U.S. Application Data

(63) Continuation-in-part of application No. 09/577,097, filed on May 24, 2000, now abandoned.

(30) Foreign Application Priority Data

Jun. 3, 1999 (KR) ............................................. 99-20538

(51) Int. Cl.
*G03F 7/11* (2006.01)
*G03F 7/09* (2006.01)
*G03F 7/00* (2006.01)

(52) U.S. Cl. .................................. 430/273.1; 430/270.1
(58) Field of Classification Search .............. 430/270.1, 430/273.1

See application file for complete search history.

(56) References Cited

U.S. PATENT DOCUMENTS

| | | | |
|---|---|---|---|
| 3,652,273 A | 3/1972 | Hioo | |
| 3,895,949 A | 7/1975 | Akamatsu et al. | |
| 4,428,871 A | 1/1984 | Ward et al. | |
| 5,624,789 A | 4/1997 | Rahman et al. | |
| 5,672,577 A | 9/1997 | Lee | |
| 5,783,362 A | 7/1998 | Wakiya et al. | |
| 5,911,835 A | 6/1999 | Lee et al. | |
| 5,985,519 A | 11/1999 | Kakamu et al. | |
| 6,000,411 A | 12/1999 | Lee | |
| 2001/0003030 A1 * | 6/2001 | Jung et al. ............... | 430/273.1 |

FOREIGN PATENT DOCUMENTS

| | | |
|---|---|---|
| DE | 44 15 113 A1 | 11/1994 |
| EP | 0 275 147 A2 | 7/1988 |
| EP | 0 488 372 A1 | 6/1992 |
| EP | 0 703 499 A1 | 3/1996 |
| EP | 0 751 433 A2 | 1/1997 |
| EP | 0 803 776 A2 | 10/1997 |
| KR | 94-0004723 | 3/1994 |
| KR | 99-003857 | 1/1999 |
| KR | 99-004682 | 1/1999 |
| WO | WO 92/05474 | 4/1992 |

OTHER PUBLICATIONS

U.S. Appl. No. 09/728,535, filed Dec. 1, 2000, Jae Chang Jung et al.

(Continued)

*Primary Examiner*—Amanda Walke
(74) *Attorney, Agent, or Firm*—Townsend and Townsend and Crew LLP

(57) ABSTRACT

The present invention provides an over-coating composition comprising a basic compound for coating a photoresist composition to provide a vertical photoresist pattern.

8 Claims, 4 Drawing Sheets

OTHER PUBLICATIONS

W.D. Hinsberg et al., "Influence of Polymer Properties on Airborne Chemical Contamination of Chemically Amplified Resists," SPIE vol. 1925, 1993, pp. 43–52.

Hiroshi Ito et al., "Approach Toward Environmental Stabilization of Chemical Amplification Resists," Journal of Photopolymer Science and Technology, vol. 6, No. 4, 1993, pp. 547–562.

Greg Breyta et al., "The Lithographic Performance and Contamination Resistance of a New Family of Chemically Amplified DLV Photoresists," Journal of Photopolymer Science and Technology, vol. 7, No. 3, 1994, pp. 449–460.

Hiroshi Ito et al., "Environmentally Stable Chemical Amplification Positive Resist: Principle, Chemistry, Contamination Resistance, and Lithographic Feasibility," Journal of Photopolymer Science and Technology, vol. 7, No. 3, 1994, pp. 433–448.

Hiroshi Ito, et al., "Annealing Concept for the Design of Environmentally Stable Chemical Amplification Resists," Journal of Photopolymer Science and Technology, vol. 8, No. 4, 1995, pp. 505–518.

Yoshio Kawai et al., "Environmental Stability of a KrF Chemically Amplified Positive Resist with an Organic Base," Journal of Photopolymer Science and Technology, vol. 8, No. 4, 1995, pp. 535–542.

Satoshi Saito et al., "High Performance Chemically Amplified Positive Electron–Beam Resist: Optimization of Base Additives for Environmental Stabilization," Journal of Photopolymer Science and Technology, vol. 9, No. 4, 1996, pp. 677–684.

S. Funato et al., "Photodecomposable Bases: A Novel Concept to Stabilize Chemically Amplified Resists," Journal of Photopolymer Science and Technology, vol. 8, No. 4, 1995, pp. 543–554.

Jiro Nakamura et al., "Effect of Overcoats on Environmental Stability of a Chemically Amplified Positive Resist Against Water and Organic Bases," Journal of Photopolymer Science and Technology, vol. 8, No. 4, 1995, pp. 555–560.

Akira Oikawa et al., "Stabilization of the Chemically Amplified Resist Process," Journal of Photopolymer Science and Technology, vol. 8, No. 4, 1995, pp. 519–524.

WPI Abstract, EP 0290916 A2.

WPI Abstract, DE 4117127 A1.

WPI Abstract, DE 4415113 A1.

Japan Patent Abstract, Publication No. 08305032, dated Nov. 11, 1996.

* cited by examiner

TOP-COATING COMPOSITION FOR PHOTORESIST AND PROCESS FOR FORMING FINE PATTERN USING THE SAME

This application is a continuation-in-part of application Ser. No. 09/577,097 filed May 24, 2000, now abandoned.

BACKGROUND OF THE INVENTION

1. Field of the Invention

The present invention relates to an over-coating composition and processes for forming a fine pattern using the same. In particular, the present invention relates to an over-coating composition comprising a basic compound, and methods for forming ultrafine (i.e., <150 nm) patterns using the same. The over-coating composition of the present invention is particularly suitable in a photolithography process using photoresist resins having a low light transmittance.

2. Description of the Background Art

In a photolithography process, an exposure of photoresist to light of a particular wavelength generates an acid from the photoacid generator present in the photoresist. The photo generated acid causes the main chain or the branched chain of the resin to decompose or become cross-linked. In addition, the acid removes the acid labile group and changes the polarity of the photoresist in the exposed region. This polarity change creates a solubility difference between the exposed portion and the unexposed portion in a developing solution, thereby allowing a pattern formation. The resolution of the pattern that is formed depends on the wavelength, i.e., in general, a shorter wavelength allows formation of more minute patterns.

Fine photoresist patterns of 150 nm L/S have successfully been developed using a light source which produces light having wavelength of 248 nm (KrF). Attempts at forming high quality fine circuit patterns smaller than 150 nm have thus far been relatively unsuccessful. These attempts have used light sources which generate short wavelengths such as ArF (193 nm), $F_2$ (157 nm) and EUV (13 nm) and have employed photoresist resins having a low transmittance to the short wavelengths, resulting in poor quality patterns. For example, a photoresist resin which has been used with i-line (365 nm) and KrF (248 nm) light sources contains aromatic compounds, which have a relatively high absorbance of 193 nm wavelength light. Photoresists comprising acrylic or alicyclic resins which do not contain aromatic compounds have also been synthesized and used; unfortunately, these resins also have a relatively high absorbance of 193 nm wavelength light.

Use of conventional chemically amplified photoresist resins having a low transmittance is undesirable because the low transmittance results in more light reaching the upper portion of the photoresist than the bottom portion, which results in higher acid concentration in the upper portion of the photoresist than in the bottom portion of the photoresist, which can result in a bulk slope profile pattern. See FIG. 1b. This is contrasted to a pattern formed when the photoresist resin has a relatively low light absorbance. In this case, the amount of light reaching the upper and bottom portions of the photoresist is nearly identical, thus forming a desired vertical pattern. See FIG. 1a.

In order to overcome the above disadvantages, efforts have been directed at synthesizing resins having a low light absorbance, in particular for light wavelengths of 157 nm ($F_2$) and 13 nm (EUV). Unfortunately, these attempts have proven unsuccessful as acids generated in the exposed area of the photoresists are neutralized by atmospheric amines during the time between the exposure and post exposure baking ("post exposure delay effect"). Since pattern formation depends on acids that are generated by the exposure, neutralization of acids by atmospheric amine compounds reduces, prevents or alters a pattern or the pattern may have a T-shape ("T-topping"). This problem is especially acute when the concentration of environmental amines is over 30 ppb, which can lead to no pattern formation.

SUMMARY OF THE INVENTION

Accordingly, an object of the present invention is to provide an over-coating composition containing a basic compound that can solve the above-mentioned problems.

Another object of the present invention is to provide a process for forming a photoresist pattern by using the above over-coating composition.

Still another object of the present invention is to provide a semiconductor device produced by using the above described over-coating composition.

DETAILED DESCRIPTION OF THE PREFERRED EMBODIMENTS

Figure 1A:
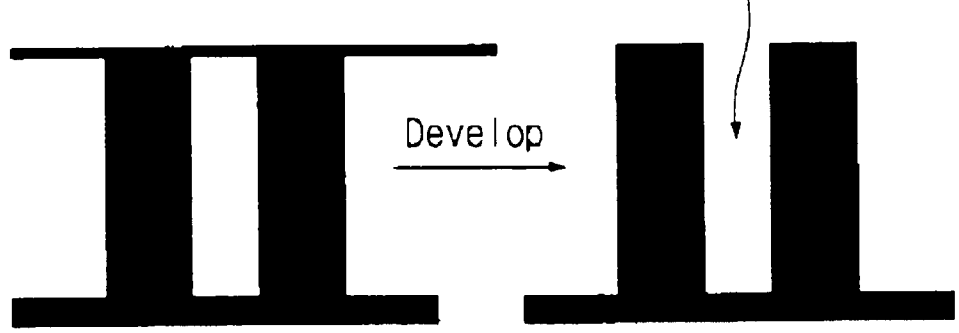
FIG. 1a shows a pattern profile obtained when the photoresist resin having little absorbance to a light source is used.

The present invention provides an over-coating composition comprising a basic compound, which achieves the above-stated objectives. The present invention also provides processes for forming a vertical photoresist pattern, even when a photoresist resin has a relatively high absorbance to light used in pattern formation.

In one particular aspect, the present invention provides an over-coating composition comprising an over-coating resin, a solvent, and a basic compound. The over-coating composition of the present invention is particularly useful in producing a vertical photoresist pattern by coating a photoresist composition prior to a photoresist pattern formation.

The over-coating resin of the present invention is preferably a water-soluble polymer. In one embodiment of the present invention, the over-coating resin is derived from a monomer selected from the group consisting of acrylic acid, alkyl acrylate, and mixtures thereof. Preferably, the over-coating resin is derived from a mixture of monomers comprising acrylic acid and alkyl acrylate. Preferably, alkyl acrylate is $C_1$–$C_6$ alkyl acrylate, more preferably unsubstituted $C_1$–$C_6$ alkyl acrylate, and most preferably methyl acrylate. Thus, a particularly useful over-coating resin includes poly(acrylic acid/methyl acrylate).

Preferably, the solvent in the over-coating composition is an aqueous solvent. A particularly preferred solvent for the over-coating composition is water.

Preferably, the basic compound in the over-coating composition is a water-soluble compound, including cyclic and acyclic compounds comprising at least one nitrogen atom (i.e., nitrogen-containing compound). Exemplary nitrogen-containing compounds which are useful in the present invention include amine compounds, such as amino acids; amide compounds; urethane compounds, such as urea; derivatives and salts thereof, and mixtures thereof.

Preferably, pKa of the conjugate acid of the basic compound (i.e., protonated basic compound) is about 13 or less, preferably about 11 or less, more preferably about 9 or less, and most preferably about 7 or less.

In one particular embodiment of the present invention, the basic compound is a compound of formula I:

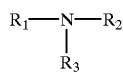

I where each of $R_1$, $R_2$ and $R_3$ is independently H or $C_1$–$C_{20}$ alkyl. Alkyl groups according to the present invention are aliphatic hydrocarbons which can be straight or branched chain groups. Alkyl groups optionally can be substituted with one or more substituents, such as a halogen, alkenyl, alkynyl, aryl, hydroxy, amino, thio, alkoxy, carboxy, oxo or cycloalkyl. There may be optionally inserted along the alkyl group one or more oxygen, sulfur or substituted or unsubstituted nitrogen atoms. Preferred alkyl groups include unsubstituted alkyl groups, and alkyl groups containing one or more substituents selected from the group consisting of hydroxy, amine, and carbonyl (such as ketone, carboxylic acid, and ester) groups. And more preferably, each alkyl group is independently selected from the group consisting of $C_1$–$C_{20}$ alkyl, $C_1$–$C_{20}$ hydroxyalkyl, $C_1$–$C_{20}$ alkyl carboxylic acid, $C_1$–$C_{20}$ alkylamine, $C_1$–$C_{20}$ alkylketone, and $C_1$–$C_{20}$ alkylester. As used herein, "hydroxyalkyl"refers to an alkyl group substituted with a hydroxy functional group. The term "alkyl carboxylic acid" refers to an alkyl group substituted with a carboxylic acid functional group. The term "alkylketone" refers to a moiety of the formula —Ra—C(=O)—Rb—, where Ra and Rb are alkyl groups defined above, preferably Ra and Rb are unsubstituted alkyl. And the term "alkyl ester" refers to an alkyl group substituted with an ester functional group.

In one aspect of the present invention, the basic compound is selected from the group consisting of an amino acid, tetraalkylammonium salt, tri(hydroxyalkyl)ammonium salt, and mixtures thereof. A particularly preferred amino acid includes L-proline. Preferred tetraalkylammonium salt includes tetramethylammonium hydroxide (TMAH) and tetramethylammonium hydroxide pentahydrate. And preferred tri(hydroxyalkyl)ammonium salt includes triethanolamine.

The amount of basic compound present in the over-coat composition of the present invention is preferably about 0.001 to about 0.1 mol %, and more preferably about 0.01 mol % relative to the solvent employed.

The amount of solvent used in preparation of the over-coat composition of the present invention is preferably in the range of from about 1000 to about 7000% by weight of the over-coating resin, and more preferably about 4000% by weight.

Figure 1B:
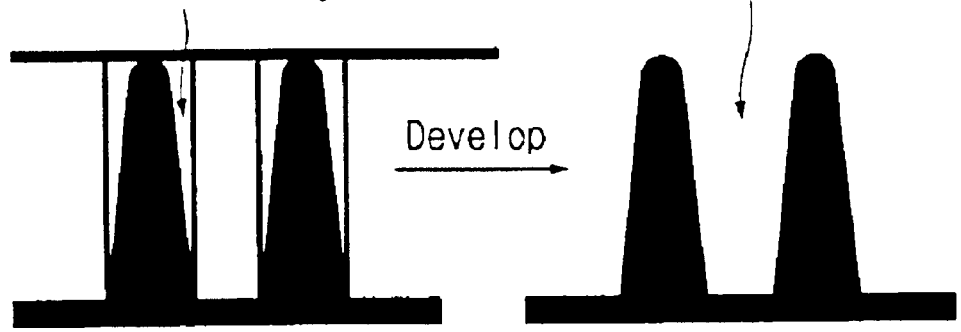
FIG. 1b shows a pattern profile obtained when the photoresist resin having much absorbance to a light source is used.

Without being bound by any theory, it is believed for a photoresist resin having a low transmittance, more acid is generated in the upper portion of the photoresist film than the bottom portion (see Figure 1b). As used herein the term "low transmittance" means that the photoresist resin has a high absorbance of the wavelength such that most of the light is absorbed in the upper portion of the photoresist film and only a small amount of light penetrates down into the lower portion of the photoresist film. It is believed that the basic compound in the over-coating composition diffuses or penetrates into the photoresist film layer, and neutralizes at least a portion of the acids in the upper portion of the photoresist film, thereby providing a more uniform acid concentration throughout the photoresist film depth. For example, as the basic compound penetrates into the photoresist film, initially a large amount of basic compound is present in the upper portion of the photoresist film relative to the bottom portion of the photoresist film. Some of these basic compounds are neutralized by the acids that are generated by photolysis, thus there is a gradual decrease in the amount of basic compound diffusing further down towards the lower portion of the photoresist film. This results in a basic compound gradient along the depth of the photoresist film preventing or reducing the formation of a sloped photoresist pattern caused by a high light absorbance by the photoresist resin.

In addition, it is believed that the over-coating composition of the present invention reduces or prevents neutralization of acids generated during a photolysis by environmental amine compounds during the post exposure delay (i.e., PED), thereby reducing or preventing T-topping. Thus, the over-coating composition acts as a buffer to prevent the acid generated at the exposed area from being neutralized by the environmental amine compounds during PED. It is also believed that the basic compound in the over-coating composition of the present invention reduces or prevents acids that are generated during a photolysis from diffusing into an unexposed area of the photoresist film, thereby providing a superior photoresist pattern.

The present invention also provides a process for forming a photoresist pattern comprising the steps of:

(a) coating a photoresist composition on a substrate to form a photoresist film;

(b) coating the over-coating composition of the photoresist film to produce an over-coated substrate;

(c) exposing the over-coated substrate to light using a light source; and (d) developing the light exposed over-coated substrate.

The photoresist composition can comprise any currently known chemically amplified photoresist resin, including poly(tert-butyl bicyclo[2.2.1]hept-5-ene-2-carboxylate/2-hydroxyethyl bicyclo[2.2.1]hept-5-ene-2-carboxylate/bicyclo[2.2.1]hept-5-ene-2-carboxylic acid/maleic anhydride).

The process for producing the photoresist pattern can also comprise baking step(s) before and/or after exposing the over-coated substrate light. The baking step is typically performed at temperature of from about 10 to about 200° C.

Exemplary light sources which are useful for forming a photoresist pattern include ArF(193 nm), KrF(248 nm), $F_2$(157 nm), EUV(13 nm), E-beam, X-ray and ion beam.

In another embodiment, the present invention also provides a semiconductor element that is manufactured using the over-coating composition described above.

The present invention will now be described in more detail by referring to the examples below, which are not intend to be limiting.

Invention Example 1. Measurement of Absorbance

DHA 1001 (a photoresist composition manufactured by Dong-jin Semichem Inc.) comprising poly(tert-butyl bicyclo

[2.2.1]hept-5-ene-2-carboxylate/2-hydroxyethyl bicyclo [2.2.1]hept-5-ene-2-carboxylate/bicyclo[2.2.1]hept-5-ene-2-carboxylic acid/maleic anhydride) as a photoresist resin was coated on a quartz-wafer, baked at 150° C. for 90 seconds, and cooled to 23° C. (photoresist thickness: about 1 µm). Here, transmittance of the photoresist measured by JASCO VUV 200 spectrometer was 45%.

Comparative Example 1

At an environmental amine concentration of 1 ppb, the photoresist composition used in Invention Example 1 was coated on the wafer at a thickness of about 0.4 µm, baked at 150° C. for 90 seconds, and cooled to 23° C.

Figure 2:
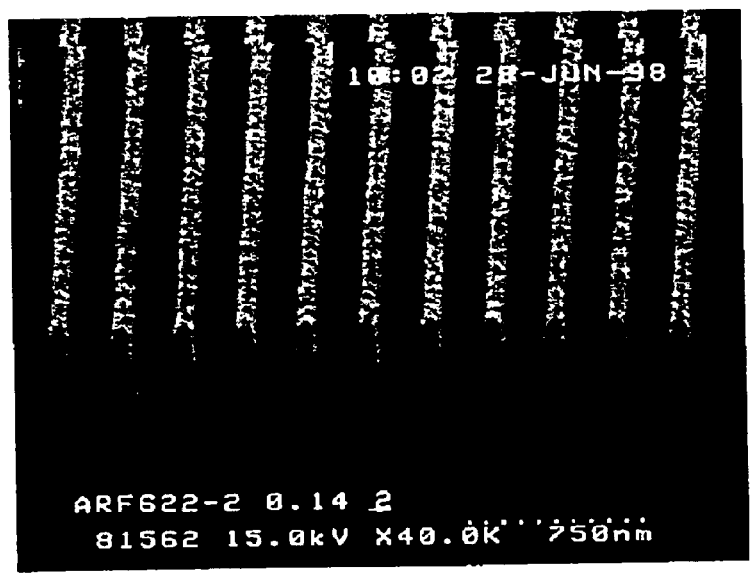
FIG. 2 shows a photoresist pattern obtained in Comparative Example 1.

Thereafter, the coated photoresist was exposed to light using an ArF exposer, baked at 140° C. for 90 seconds, and developed in 2.38 wt % TMAH solution to obtain a 140 nm L/S pattern. As shown in FIG. 2, the photoresist pattern was severely sloped due to the low transmittance of the photoresist composition.

Comparative Example 2

The procedure of Comparative Example 1 was repeated, except the environmental amine concentration was 5 ppb instead of 1 ppb. A vertical pattern shown in FIG. 3 was obtained.

Comparative Example 3

The procedure of Comparative Example 1 was repeated, except the environmental amine concentration was 40 ppb instead of 1 ppb. A photoresist pattern having a rounded upper portion shown in FIG. 4 was obtained.

Figure 3:
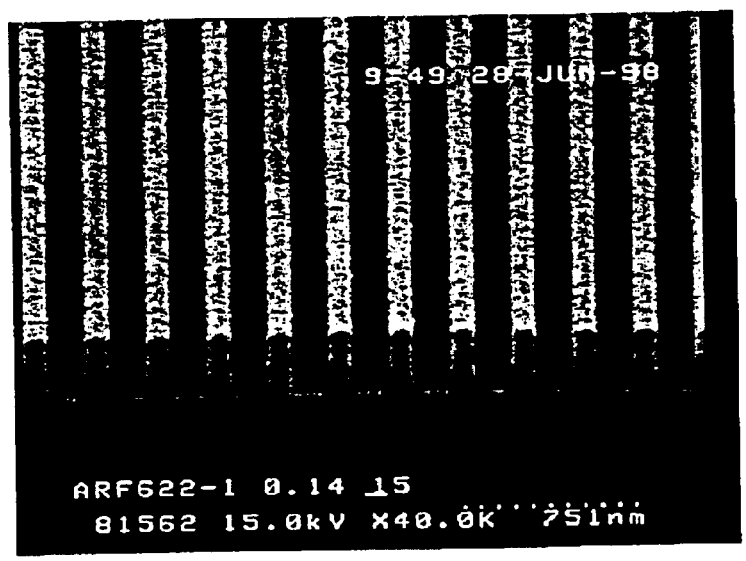
FIG. 3 shows a photoresist pattern obtained in Comparative Example 2.

As shown in the Comparative Examples 1 to 3, when the concentration of environmental amine is low, a relatively severely sloped photoresist pattern was obtained due to a low transmittance of the photoresist (see FIG. 2). As described above with reference to FIG. 1b, it is believed that this sloping photoresist pattern is due to the fact that the amount of light reaching the upper portion of the photoresist film is greater than the amount of light reaching the bottom portion of the photoresist film, which results in a higher amount acids generated in the upper portion of the photoresist film. But as can be seen in FIG. 3, a vertical photoresist pattern is formed when the concentration of environmental amine is increased from 1 ppb to 5 ppb. It is believed that this is because the environmental amine come in contact with and penetrates into the photoresist and neutralizes the acid in the upper portion of the photoresist film, while only a small amount of the environmental amine compound penetrates into the bottom portion of the photoresist film. Thus, when the amount of environmental amine present is high, the acid concentration gradient along the depth of the photoresist film, which is produced by a photolysis of photoresist composition having a high absorbance, is minimized by a similar environmental amine compound gradient along the depth of the photoresist film. This results in a vertical photoresist pattern as shown in FIG. 3.

Figure 4:
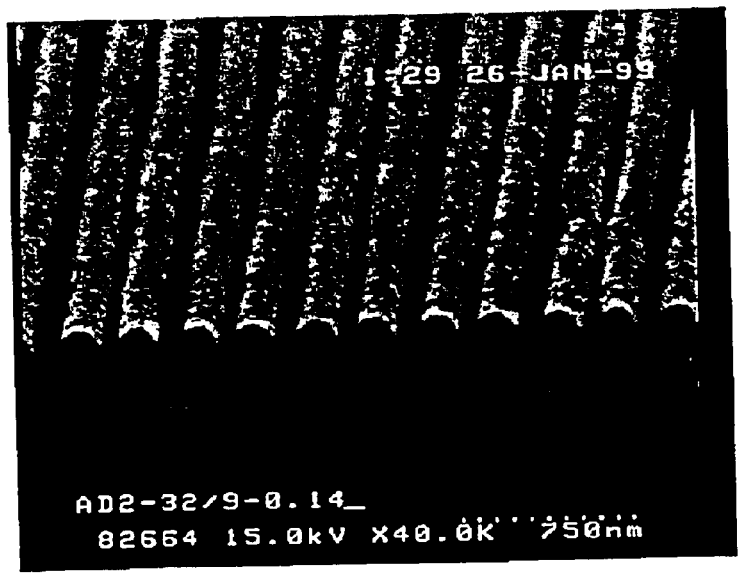
FIG. 4 shows a photoresist pattern obtained in Comparative Example 3.

However, when the concentration of the environmental amine compound is 40 ppb or more, the amount of environmental amine compound is significantly higher than the amount of acid that is typically generated during the photolysis resulting in a photoresist pattern having a swollen upper portion as shown in FIG. 4.

At the environmental amine concentration of 5 ppb, a high quality photoresist pattern was obtained using a low transmittance photoresist resin. Unfortunately, the environmental amine concentration can not be maintained constantly at 5 ppb throughout a semiconductor device fabrication process. Typically, the environmental amine concentration varies continuously during an actual semiconductor device fabrication process.

Preparation Example: Synthesis of Over-coating Resin 9 g of acrylic acid, 1 g of methyl acrylate, 50 g of isobutyl methyl ketone, 50 g of propylene glycol methyl ether acetate and 3.0 g of AIBN were combined and heated to about 67° C. for 3 hours under an inert atmosphere (e.g., nitrogen gas). The precipitated polymer was washed with ethyl ether and vacuum dried to obtain pure poly(acrylic acid/methyl acrylate) resin (weight average molecular weight: 7200, yield: 54%).

Comparative Example 4. Preparation of Over-coating Composition

To 200 g of distilled water was added 5 g of poly(acrylic acid/methyl acrylate) resin prepared in the Preparation Example. The resulting solution was filtered through 0.20 µm-filter to produce an over-coating composition.

Invention Example 2. Synthesis of Over-coating Composition Containing Basic Compound To 200 g of distilled water was added 0.16 g of L-proline and 5 g of poly(acrylic acid/methyl acrylate). The resulting solution was filtered through 0.20 µm-filter to produce the over-coating composition of the present invention.

Comparative Example 5

Figure 5:
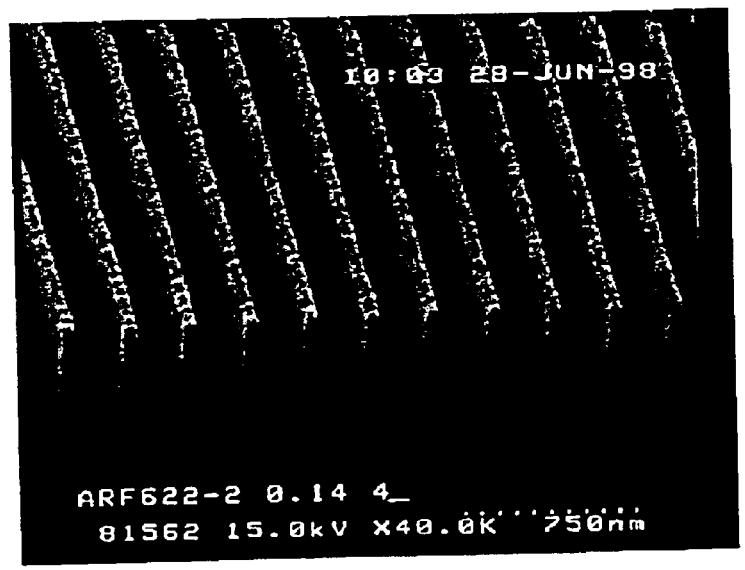
FIG. 5 shows a photoresist pattern obtained in Comparative Example 5.

DHA1001 photoresist composition used in Invention Example 1 was coated on a wafer, baked at 110° C. for 90 seconds, and cooled to 23° C. in an environmental amine concentration of 20 ppb. The over-coating composition of Comparative Example 4 which does not contain L-proline was coated on the photoresist film, baked at 60° C. for 60 seconds, and cooled. After baking, the wafer was exposed to light using an ArF laser exposer, and then post-baked at 110° C. for 90 seconds. When the post-baking was completed, it was developed in 2.38 wt % aqueous TMAH solution to obtain a 140 nm L/S pattern. As shown in FIG. 5, the photoresist pattern was sloped similar to those shown in FIG. 1b and FIG. 2. When the over-coating composition was not used (similar to Comparative Example 2) the vertical pattern was formed at the environmental amine concentration of 5 ppb. However, at the environmental amine concentration of 20 ppb, a relatively severely sloped photoresist pattern was formed even when an over-coating composition was used (see FIG. 5). Without being bound by any theory, it is believed that this sloping photoresist pattern is due to: (i) a high environmental amine concentration, (ii) absence of a basic compound in the over-coating composition which can neutralize acids in the upper portion of photoresist film, and/or (iii) the over-coating composition preventing the environmental amines from penetrating into the upper portion of photoresist film and neutralizing the acids.

Invention Example 3

DHA1001 photoresist composition was coated on a wafer, baked at 110° C. for 90 seconds, and cooled to 23° C. in an environmental amine concentration of 20 ppb. Thereafter, the over-coating composition of Invention Example 2 containing L-proline was over-coated on the photoresist film, baked at 60° C. for 60 seconds, and cooled. After baking, the wafer was exposed to light using an ArF laser exposer, and then post-baked at 110° C. for 90 seconds. When the post-baking was completed, it was developed in 2.38 wt % aqueous TMAH solution to obtain a 140 nm L/S pattern (see FIG. 6).

Figure 6:
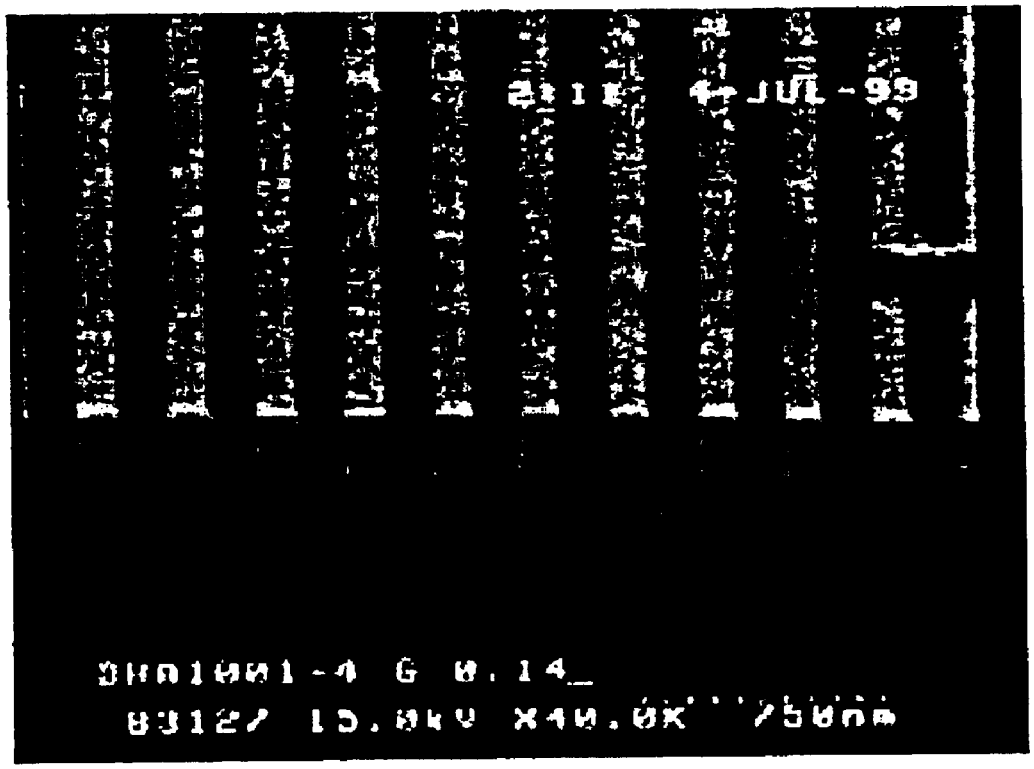
FIG. 6 shows a photoresist pattern obtained in Invention Example 3.

The pattern profile shown in FIG. 6 is vertical similar to that shown in FIG. 1a and FIG. 3. It is believed that L-proline in the over-coating composition penetrates into the photoresist film layer and neutralizes at least a portion of a large amount of acids that are generated in the upper portion of the photoresist, thereby preventing or significantly reducing the formation of a sloped photoresist pattern.

As shown above, when the over-coating composition of the present invention is used, it is believed that the basic compound in the over-coating composition penetrates into the photoresist film layer, thereby providing an amine gradient within the photoresist film. Accordingly, a relatively large amount of acid on the upper portion of the photoresist film is neutralized resulting in a vertical photoresist pattern even when the photoresist resin has a high light absorbance.

What is claimed is:

1. An amine contamination-protecting top-coating composition for photoresist comprising:
   (a) a top-coating composition; and
   (b) a basic compound of which conjugate acid has pKa of about 8 or less in an amount equal to 0.015 to 0.5% by weight of the top-coating composition.

2. The amine contamination-protecting top-coating composition according to claim 1, wherein said top-coating composition comprises a water soluble solvent and a water soluble organic resin.

3. The amine contamination-protecting top-coating composition according to claim 1, wherein said basic compound is a nitrogen containing compound.

4. The amine contamination-protecting top-coating composition according to claim 1, wherein said basic compound is selected from the group consisting of amine derivatives; amino acid derivatives; amide derivatives; urethane derivatives; urea derivatives; salts thereof; and mixtures thereof.

5. The amine contamination-protecting top-coating composition according to claim 4, wherein said amine derivative is of the formula:

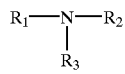

wherein, each of $R_1$, $R_2$ and $R_3$ is independently H, or straight or branched $C_1$–$C_{20}$ alkyl.

6. The amine contamination-protecting top-coating composition according to claim 5, wherein said alkyl is (i) unsubstituted straight or branched alkyl; or (ii) substituted straight or branched alkyl selected from the group consisting of straight or branched C1–C20 alcohol (—OH), straight or branched C1–C20 carboxylic acid, straight or branched C1–C20 amine, straight or branched C1–C20 ketone, and straight or branched C1–C20 ester.

7. The amine contamination-protecting top-coating composition according to claim 5, wherein said alkyl is substituted with one or more substituents selected from the group consisting of halogen, alkenyl, alkynyl, aryl, hydroxy, amino, thio, alkoxy, carboxy, oxo and cycloalkyl.

8. The amine contamination-protecting top-coating composition according to claim 1, wherein said basic compound is selected from the group consisting of L-proline, triethanolamine, aniline, p-nitroaniline, p-aminotoluene, 3-amino-1-propanesulfonic acid, 4-aminotoluene-5-sulfonic acid, 4-aminosalicyclic acid, 4-aminophenol, 2-amino-2-norbornanecarboxylic acid, 2-aminonicotinic acid, 2-aminobutyric acid, alanine, aspartic acid, cysteine, glutamine, serine and mixtures thereof.

* * * * *

UNITED STATES PATENT AND TRADEMARK OFFICE
CERTIFICATE OF CORRECTION

PATENT NO. : 6,984,482 B2
APPLICATION NO. : 10/174497
DATED : January 10, 2006
INVENTOR(S) : Jung et al.

It is certified that error appears in the above-identified patent and that said Letters Patent is hereby corrected as shown below:

On the Title Page, Item (57)
Abstract, delete entire Abstract and insert the following.

--The present invention provides to an amine contamination-protecting top-coating composition and a process for using the same. Preferably, the amine contamination-protecting top-coating composition of the present invention comprises an amine contamination-protecting compound. Useful amine contamination-protecting compounds include amine derivatives; amino acid derivatives; amide derivatives; urethane derivatives; urea derivatives; salts thereof; and mixtures thereof. The amine contamination-protecting top-coating composition of the present invention reduces or eliminates problems such as T-topping due to a post exposure delay effect and/or difficulties in forming a fine pattern below 100 nm due to acid diffusion associated with conventional lithography processes involving a photoresist polymer containing an alicyclic main chain using a light source, such as KrF (248nm), ArF (193nm), $F_2$ (157nm), E-beam, ion beam and extremely ultraviolet (EUV).--

Column 1, line 9, through column 7, line 9, delete entire specification and insert the following.

--BACKGROUND OF THE INVENTION

1. Field of the Invention

[01] The present invention relates to a top-coating composition, for a photolithography process, and a process for forming a pattern using the same.

2. Description of the Background Art

[02] Chemical amplification-type DUV photoresists have been used to achieve high sensitivity in minute image formation processes for preparing semiconductor devices. Such photoresists are prepared by blending a photoacid generator and a matrix resin polymer having an acid labile group.

[03] It is believed that when a photoresist (sometimes referred to as "PR") composition is illuminated by an appropriate light source the photoacid generator generates acid. The resin (i.e., polymer) which is present in the photoresist decomposes or becomes cross-linked when reacted with the generated acid. This change in the resin results in the solubility differences in the developing solution between the exposed portion and the unexposed portion. Thus, by using an appropriate mask, one can form a predetermined pattern using the photoresist composition.

UNITED STATES PATENT AND TRADEMARK OFFICE
CERTIFICATE OF CORRECTION

| | |
|---|---|
| PATENT NO. | : 6,984,482 B2 |
| APPLICATION NO. | : 10/174497 |
| DATED | : January 10, 2006 |
| INVENTOR(S) | : Jung et al. |

It is certified that error appears in the above-identified patent and that said Letters Patent is hereby corrected as shown below:

Column 1, line 9, through column 7, line 9 (cont'd)

[04] In a lithography process, the image resolution generally depends on the wavelength of the light source, e.g., a shorter wavelength allows a more minute image pattern formation.

[05] Lithography processes employing light sources having a wavelength below 250nm have been recently investigated. In particular, there have been a lot of interests directed to a polymer containing alicyclic derivatives in its main or branched chain as a suitable photoresist polymer. However, utilizing these alicyclic polymers to a semiconductor fabrication process has many disadvantages. For example, chemical properties of the alicyclic polymer vary. In addition, the generated acid may be neutralized by environmental amine compounds during the time between the exposure and the post exposure baking (i.e., "post exposure delay effect"). As a result, a desired resolution are often not obtained and/or the pattern can be T-shaped (i.e., "T-topping"). One or more of these problems are especially acute when the concentration of environmental amine is over 30 ppb, which in some instances may lead to no pattern formation.

[06] In order to overcome the aforementioned disadvantages, the following methods have been suggested in the prior art:

[07] (1) An annealing method whereby the PR resin is baked over its glass transition temperature (Tg) after the PR is coated [see W. D. Hinsberg, S.A. MacDonald, N. J. Clecak, C. D, Snyder, and H. Ito, *Proc. SPIE*, 1925, (1993) 43; H. Ito, W. P. England, R. Sooriyakumaran, N.J. Clecak, G. Breyta, W. D. Hinsberg, H. Lee, and D. Y. Yoon, *J. Photopolymer Sci. and Technol.*, 6, (1993) 547; G. Breyta, D. C. Hofer, H. Ito, D. Seeger, K. Petrillo, H. Moritz, and T. Fischer, *J. Photopolymer Sci. and Technol.*, 7, (1994) 449; H. Ito, G. Breyta, D. Hofer, R. Sooriyakumaran, K. Petrillo, and D. Seeger, *J. Photopolymer Sci. and Technol.*, 7, (1994) 433; H. Ito, G. Breyta, R. Sooriyakumaran, and D. Hofer, *J. Photopolymer Sci. and Technol.*, 8, (1995) 505];

[08] (2) Adding an amine compound to the PR [see Y. Kawai, A. Otaka, J. Nakamura, A. Tanaka, and T. Matsuda, *J. Photopolymer Sci. and Technol.*, 8, (1995) 535; S. Saito, N. Kihara, T. Naito, M. Nakase, T. Nakasugi, and Y. Kat. *Photopolymer Sci. and Technol.*, 9, (1996) 677; S. Funato, Y. Kinoshita, T. Kuto, S. Masuda, H. Okazaki, M. Padmanaban, K. J. Przybilla, N. Suehiro, and G. Pawlowski, *J. Photopolymer Sci. and Technol.*, 8, (1995) 543]; and

UNITED STATES PATENT AND TRADEMARK OFFICE
CERTIFICATE OF CORRECTION

PATENT NO. : 6,984,482 B2
APPLICATION NO. : 10/174497
DATED : January 10, 2006
INVENTOR(S) : Jung et al.

It is certified that error appears in the above-identified patent and that said Letters Patent is hereby corrected as shown below:

Column 1, line 9, through column 7, line 9 (cont'd)

[09] (3) Adding a top-coating to the upper portion of the PR to protect it against an environmental amine contamination, after the PR coating step and the baking step [see J. Nakamura, H. Ban, Y. Kawai, and A. Tanaka, *J. Photopolymer Sci. and Technol.*, 8, (1995) 555; A. Oikawa, V. Hatakenaka, Y. Ikeda, Y. Kokubo, S. Miyata, N. Santoh, and N. Abe, *J. Photopolymer Sci. and Technol.*, 8, (1995) 519].

[10] Even using one or more of these techniques it is difficult to form an ultrafine pattern. In addition, the above methods have other disadvantages, such as adding complication or additional steps to a lithography process.

SUMMARY OF THE INVENTION

[11] Accordingly, an object of the present invention is to provide a top-coating composition containing an amine contamination-protecting compound that can solve the above-mentioned problems, and a process for forming a photoresist pattern using the same.

BRIEF DESCRIPTION OF THE DRAWINGS

[12] Figures 1 and 2 are SEM photographs showing a conventional photoresist pattern; and

[13] Figures 3 to 20 are SEM photographs showing a photoresist pattern in accordance with a preferred example of the present invention.

DETAILED DESCRIPTION OF PREFERRED EMBODIMENTS

[14] The present invention provides a top-coating composition, which is useful in a photolithography process, and a process for forming a pattern using the same. In particular, the present invention provides a top-coating composition for protecting amine-contamination and a method for forming a fine pattern by using the same. Compositions and methods of the present invention are particularly useful in a photolithography process utilizing a light sources having an ultrashort wavelength below 250 nm.

UNITED STATES PATENT AND TRADEMARK OFFICE
CERTIFICATE OF CORRECTION

| | |
|---|---|
| PATENT NO. | : 6,984,482 B2 |
| APPLICATION NO. | : 10/174497 |
| DATED | : January 10, 2006 |
| INVENTOR(S) | : Jung et al. |

It is certified that error appears in the above-identified patent and that said Letters Patent is hereby corrected as shown below:

Column 1, line 9, through column 7, line 9 (cont'd)

[15] Specifically, the present invention provides an amine contamination-protecting top-coating composition comprising a top-coating material and an amine contamination-protecting compound which has a basic or weakly basic property (i.e., a basic compound). The present invention also provides a method for forming a fine pattern by using the same.

[16] Any of the commercially available top-coating compositions for producing semiconductor devices can be used in the present invention. Such top-coating compositions are well known to one skilled in the art. Examples of such top-coating compositions are sold under the designations "NFC 540" by Japan Synthetic Rubber in Japan, and "Aquatar" by Clariant Inc. in Switzerland.

[17] The amine contamination-protecting compound of the present invention is a basic compound, preferably weakly basic compound, more preferably a water-soluble compound including cyclic and acyclic nitrogen-containing compounds. Exemplary nitrogen-containing compounds which are useful in the present invention include amine derivatives; amino acid derivatives; amide derivatives; urethane derivatives; urea derivatives; and salts thereof. The amount of amine contamination-protecting compound present in the composition of the present invention is preferably from about 0.015 to about 0.5 weight % relative to the amount of top-coating composition.

[18] Preferably, the conjugate acid (i.e., a protonated form) of the basic compound has pKa of about 8 or less.

[19] In one particular embodiment, the amine contamination-protecting compound is a compound of formula I:

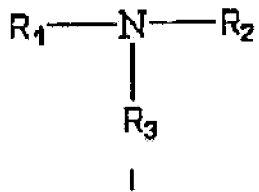

where each of $R_1$, $R_2$ and $R_3$ is independently H or $C_1$-$C_{20}$ alkyl. Alkyl groups according to the present invention are aliphatic hydrocarbons which can be straight or branched chain groups. Alkyl groups optionally can be substituted with one or more substituents, such as a halogen, alkenyl, alkynyl, aryl, hydroxy, amino, thio, alkoxy, carboxy, oxo or cycloalkyl.

UNITED STATES PATENT AND TRADEMARK OFFICE
CERTIFICATE OF CORRECTION

PATENT NO. : 6,984,482 B2
APPLICATION NO. : 10/174497
DATED : January 10, 2006
INVENTOR(S) : Jung et al.

It is certified that error appears in the above-identified patent and that said Letters Patent is hereby corrected as shown below:

Column 1, line 9, through column 7, line 9 (cont'd)

There may be optionally inserted along the alkyl group one or more oxygen, sulfur or substituted or unsubstituted nitrogen atoms. Preferred alkyl groups include unsubstituted alkyl groups and substituted alkyl groups containing one or more hydroxy, amine, and/or carbonyl (such as ketone, carboxylic acid, and ester) groups, i.e., straight or branched $C_1$-$C_{20}$ alkyl, straight or branched $C_1$-$C_{20}$ alcohol (-OH), straight or branched $C_1$-$C_{20}$ carboxylic acid, straight or branched $C_1$-$C_{20}$ amine, straight or branched $C_1$-$C_{20}$ ketone, or straight or branched $C_1$-$C_{20}$ ester.

[20] In one aspect of the present invention, the amine contamination-protecting compound comprises an amino acid, in particular L-proline (i.e., compound of formula II), triethanolamine (i.e., compound of formula III), and mixtures thereof. Preferably, the amine contamination-protecting compound comprises triethanolamine.

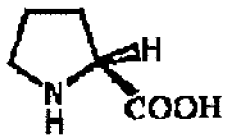
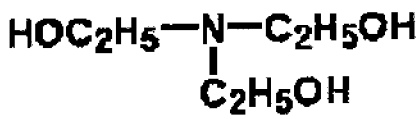

II          III

[21] In another embodiment, the amine contamination-protecting compound is preferably selected from the group consisting of aniline, p-nitroaniline, p-aminotoluene, 3-amino-1-propanesulfonic acid, 4-aminotoluene-5-sulfonic acid, 4-aminosalicyclic acid, 4-aminophenol, 2-amino-2-norbornanecarboxylic acid, 2-aminonicotinic acid, 2-aminobutyric acid, alanine, aspartic acid, cysteine, glutamine, serine and mixtures thereof.

[22] It has been discovered by the present inventors, that when a top-coating step is carried out using the amine contamination-protecting top-coating composition of the present invention, an ultrafine pattern having an excellent profile can be formed. Without being bound by any theory, it is believed that the amine contamination-protecting top-coating composition of the present invention effectively intercepts environmental amine contamination during the post exposure delay (hereinafter, referred to as 'PED'), and prevents acid, which is generated by the light exposure, from diffusing into an unexposed area. That is, when an amine contamination-protecting compound of the present invention is added to a conventional top-coating composition, the resulting amine contamination-protecting top-coating composition has a suitable basic

UNITED STATES PATENT AND TRADEMARK OFFICE
CERTIFICATE OF CORRECTION

PATENT NO. : 6,984,482 B2
APPLICATION NO. : 10/174497
DATED : January 10, 2006
INVENTOR(S) : Jung et al.

It is certified that error appears in the above-identified patent and that said Letters Patent is hereby corrected as shown below:

Column 1, line 9, through column 7, line 9 (cont'd)

property to act as a buffer to prevent the acid generated at the exposed area from being contaminated by the environmental amine compounds.
In addition, the amine contamination-protecting top-coating composition of the present invention is coated at the upper portion of the PR. It is believed that the amine contamination-protecting compound contained in the amine contamination-protecting top-coating composition of the present invention restricts acid diffusion on the PR surface, thereby providing a superior pattern (i.e., image having a vertical profile).

[23] Additional objects, advantages, and novel features of this invention will become apparent to those skilled in the art upon examination of the following examples thereof, which are not intended to be limiting.

EXAMPLES

[24] In order to confirm the effects of the top-coating composition according to the present invention, a PR pattern is formed in the following Examples by employing a top-coating process which comprises:

(a) coating a photoresist composition on a substrate to form a photoresist film;

(b) coating a top-coating composition on the upper portion of the photoresist film to form a top-coating;

(c) exposing the resultant coated substrate to light using an exposer; and (d) developing the resultant product.

[25] The PR composition used above is prepared by dissolving (i) poly(2-hydroxyethyl 5-norbornene-2-carboxylic acid / *tert*-butyl 5-norbornene-2-carboxylate / 5-norbornene-2-carboxylic acid / maleic anhydride), (ii) a photoacid generator and (iii) certain other optional additives in (iv) propylene glycol methyl ether acetate (PGMEA) solvent [see J. C. Jung, C. K. Bok, and K. H. Baik, *J. Photopolymer Sci. and Technol.*, 10, (1997) 529; J. C. Jung, C. K. Bok, and K. H. Baik, *Proc. SPIE*, 3333, (1998) 11; J. C. Jung, M. H. Jung, and K. H. Baik, *J. Photopolymer Sci. and Technol.*, 11, (1998) 481].

UNITED STATES PATENT AND TRADEMARK OFFICE
CERTIFICATE OF CORRECTION

| | |
|---|---|
| PATENT NO. | : 6,984,482 B2 |
| APPLICATION NO. | : 10/174497 |
| DATED | : January 10, 2006 |
| INVENTOR(S) | : Jung et al. |

It is certified that error appears in the above-identified patent and that said Letters Patent is hereby corrected as shown below:

Column 1, line 9, through column 7, line 9 (cont'd)

[26] The amine contamination-protecting top-coating composition in the Invention Examples is prepared by adding the amine contamination-protecting compound to a conventional top-coating composition.

[27] All the pattern formation experiments are performed under a condition having the environmental amine concentration of over 15 parts per billion (ppb).

COMPARATIVE EXAMPLE 1

[28] At an environmental amine concentration of 15 ppb, the PR composition is coated on the substrate, baked at 110 °C for 90 seconds, and cooled at 23 °C.

[29] Thereafter, an NFC 540 top-coating material manufactured by Japan Synthetic Rubber in Japan (hereinafter, referred to as 'JSR') is coated as a top-coating composition on the upper portion of the PR coating, baked at 60 °C for 60 seconds and cooled.

[30] The resultant product is exposed to light by an ArF exposer, baked at 110 °C for 90 seconds, and developed in 2.38 wt% TMAH solution, thereby obtaining the 150 nm pattern shown in Figure 1.

[31] As shown in Figure 1, the upper portion of the pattern is considerably damaged, and the vertical profile thereof is not complete. It is believed that this results from acid diffusion to the unexposed area during the PED.

COMPARATIVE EXAMPLE 2

[32] At an environmental amine concentration of 15 ppb, the PR composition is coated on the substrate, baked at 110 °C for 90 seconds, and cooled at 23 °C.

[33] Thereafter, an Aquatar top-coating material manufactured by Clariant Inc. in Switzerland is coated on the upper portion of the PR coating, baked at 60 °C for 60 seconds and cooled.

UNITED STATES PATENT AND TRADEMARK OFFICE
CERTIFICATE OF CORRECTION

PATENT NO. : 6,984,482 B2
APPLICATION NO. : 10/174497
DATED : January 10, 2006
INVENTOR(S) : Jung et al.

It is certified that error appears in the above-identified patent and that said Letters Patent is hereby corrected as shown below:

Column 1, line 9, through column 7, line 9 (cont'd)

[34] The resultant product is exposed to light by the ArF exposer, baked at 110 °C for 90 seconds, and developed in the 2.38 wt% TMAH solution thereby obtaining the 150 nm pattern shown in Figure 2.

[35] As illustrated in Figure 2, the upper portion of the pattern is considerably damaged as in Figure 1, and the developing state of the exposed area is not complete.

INVENTION EXAMPLE 1

[36] A novel amine contamination-protecting top-coating composition of the present invention is first prepared by blending 20 g of NFC 540 (a top-coating material manufactured by JSR) and 0.016 g of L-proline.

[37] The PR pattern is formed by repeating the procedure of Comparative Example 1 but using the above-described composition as the amine contamination-protecting top-coating composition. Briefly, at the environmental amine concentration of about 15 ppb, the PR composition is coated on the substrate, baked at 110 °C for 90 seconds, and cooled at 23 °C.

[38] Thereafter, the amine contamination-protecting top-coating composition is coated on the upper portion of the PR coating baked at 60 °C for 60 seconds and cooled.

[39] The resultant product is exposed to light by the ArF exposer, baked at 110 °C for 90 seconds, and developed in the 2.38 wt% TMAH solution, to produce the 150 nm pattern shown in Figure 3.

[40] Compared to Figure 1, the upper portion of the pattern in Figure 3 is significantly less damaged and shows a significantly improved vertical profile.

INVENTION EXAMPLE 2

[41] A novel amine contamination-protecting top-coating composition of the present invention is prepared by blending 20 g of Aquatar (a top-coating material manufactured by Clariant Inc.) and 0.016 g of L-proline.

UNITED STATES PATENT AND TRADEMARK OFFICE
CERTIFICATE OF CORRECTION

PATENT NO.       : 6,984,482 B2
APPLICATION NO.  : 10/174497
DATED            : January 10, 2006
INVENTOR(S)      : Jung et al.

It is certified that error appears in the above-identified patent and that said Letters Patent is hereby corrected as shown below:

Column 1, line 9, through column 7, line 9 (cont'd)

[42]   The top-coating process is performed by repeating the procedure of Comparative Example 2 but using the aforementioned amine contamination-protecting top-coating composition. The lithography process described in Comparative Example 2 produced the 150 nm PR pattern shown in Figure 4. Compared to Figure 2, the upper portion of the pattern of Figure 4 is significantly less damaged, and the vertical profile thereof is significantly improved.

INVENTION EXAMPLE 3

[43]   A novel amine contamination-protecting top-coating composition of the present invention is prepared by blending 20 g of Aquatar (a top-coating material manufactured by Clariant Inc.) and 0.020 g of triethanolamine.

[44]   The top-coating process is performed by repeating the procedure of Comparative Example 2 but using the aforementioned amine contamination-protecting top-coating composition to produce the 150 nm PR pattern shown in Figure 5. Compared to Figure 2, the upper portion of the pattern in Figure 5 is significantly less damaged, and the vertical profile thereof is significantly improved.

INVENTION EXAMPLE 4

[45]   A novel amine contamination-protecting top-coating composition of the present invention is prepared by blending 200 g of NFC 540 (a top-coating material manufactured by JSR) and 0.113 g of aniline.

[46]   The lithography process is carried out in the same manner as Comparative Example 1 using the above-described amine contamination-protecting top-coating composition to produce the 150 nm pattern depicted in Figure 6.

[47]   Compared to Figure 1, the upper portion of the pattern in Figure 6 is significantly less damaged and shows a significantly improved vertical profile.

UNITED STATES PATENT AND TRADEMARK OFFICE
CERTIFICATE OF CORRECTION

| | |
|---|---|
| PATENT NO. | : 6,984,482 B2 |
| APPLICATION NO. | : 10/174497 |
| DATED | : January 10, 2006 |
| INVENTOR(S) | : Jung et al. |

It is certified that error appears in the above-identified patent and that said Letters Patent is hereby corrected as shown below:

Column 1, line 9, through column 7, line 9 (cont'd)

INVENTION EXAMPLE 5

[48]    A novel amine contamination-protecting top-coating composition of the present invention is prepared by blending 200 g of NFC 540 (a top-coating material manufactured by JSR) and 0.17 g of p-nitroaniline.

[49]    The lithography process is carried out in the same manner as Comparative Example 1 using the above-described amine contamination-protecting top-coating composition to produce the 150 nm pattern depicted in Figure 7.

[50]    Compared to Figure 1, the upper portion of the pattern in Figure 7 is significantly less damaged and shows a significantly improved vertical profile.

INVENTION EXAMPLE 6

[51]    A novel amine contamination-protecting top-coating composition of the present invention is prepared by blending 200 g of NFC 540 (a top-coating material manufactured by JSR) and 0.131 g of p-aminotoluene.

[52]    The lithography process is carried out in the same manner as Comparative Example 1 using the above-described amine contamination-protecting top-coating composition to produce the 150 nm pattern depicted in Figure 8.

[53]    Compared to Figure 1, the upper portion of the pattern in Figure 8 is significantly less damaged and shows a significantly improved vertical profile.

INVENTION EXAMPLE 7

[54]    A novel amine contamination-protecting top-coating composition of the present invention is prepared by blending 200 g of NFC 540 (a top-coating material manufactured by JSR) and 0.17 g of 3-amino-1-propanesulfonic acid.

UNITED STATES PATENT AND TRADEMARK OFFICE
CERTIFICATE OF CORRECTION

PATENT NO. : 6,984,482 B2
APPLICATION NO. : 10/174497
DATED : January 10, 2006
INVENTOR(S) : Jung et al.

It is certified that error appears in the above-identified patent and that said Letters Patent is hereby corrected as shown below:

Column 1, line 9, through column 7, line 9 (cont'd)

[55] The lithography process is carried out in the same manner as Comparative Example 1 using the above-described amine contamination-protecting top-coating composition to produce the 150 nm pattern depicted in Figure 9.

[56] Compared to Figure 1, the upper portion of the pattern in Figure 9 is significantly less damaged and shows a significantly improved vertical profile.

INVENTION EXAMPLE 8

[57] A novel amine contamination-protecting top-coating composition of the present invention is prepared by blending 200 g of NFC 540 (a top-coating material manufactured by JSR) and 0.23 g of 4-aminotoluene-5-sulfonic acid.

[58] The lithography process is carried out in the same manner as Comparative Example 1 using the above-described amine contamination-protecting top-coating composition to produce the 150 nm pattern depicted in Figure 10.

[59] Compared to Figure 1, the upper portion of the pattern in Figure 10 is significantly less damaged and shows a significantly improved vertical profile.

INVENTION EXAMPLE 9

[60] A novel amine contamination-protecting top-coating composition of the present invention is prepared by blending 200 g of NFC 540 (a top-coating material manufactured by JSR) and 0.19 g of 4-aminosalicyclic acid.

[61] The lithography process is carried out in the same manner as Comparative Example 1 using the above-described amine contamination-protecting top-coating composition to produce the 150 nm pattern depicted in Figure 11.

[62] Compared to Figure 1, the upper portion of the pattern in Figure 11 is significantly less damaged and shows a significantly improved vertical profile.

UNITED STATES PATENT AND TRADEMARK OFFICE
CERTIFICATE OF CORRECTION

PATENT NO. : 6,984,482 B2
APPLICATION NO. : 10/174497
DATED : January 10, 2006
INVENTOR(S) : Jung et al.

It is certified that error appears in the above-identified patent and that said Letters Patent is hereby corrected as shown below:

Column 1, line 9, through column 7, line 9 (cont'd)

INVENTION EXAMPLE 10

[63] A novel amine contamination-protecting top-coating composition of the present invention is prepared by blending 200 g of NFC 540 (a top-coating material manufactured by JSR) and 0.13 g of 4-aminophenol.

[64] The lithography process is carried out in the same manner as Comparative Example 1 using the above-described amine contamination-protecting top-coating composition to produce the 150 nm pattern depicted in Figure 12.

[65] Compared to Figure 1, the upper portion of the pattern in Figure 12 is significantly less damaged and shows a significantly improved vertical profile.

INVENTION EXAMPLE 11

[66] A novel amine contamination-protecting top-coating composition of the present is prepared by blending 200 g of NFC 540 (a top-coating materials manufactured by JSR) and 0.19 g of 2-amino-2-norbornanecarboxylic acid.

[67] The lithography process is carried out in the same manner as Comparative Example 1 using the above-described amine contamination-protecting top-coating composition to produce the 150 nm pattern depicted in Figure 13.

[68] Compared to Figure 1, the upper portion of the pattern in Figure 13 is significantly less damaged and shows a significantly improved vertical profile.

INVENTION EXAMPLE 12

[69] A novel amine contamination-protecting top-coating composition of the present invention is prepared by blending 200 g of NFC 540 (a top-coating material manufactured by JSR) and 0.17 g of 2-aminonicotinic acid.

UNITED STATES PATENT AND TRADEMARK OFFICE
CERTIFICATE OF CORRECTION

PATENT NO. : 6,984,482 B2
APPLICATION NO. : 10/174497
DATED : January 10, 2006
INVENTOR(S) : Jung et al.

It is certified that error appears in the above-identified patent and that said Letters Patent is hereby corrected as shown below:

Column 1, line 9, through column 7, line 9 (cont'd)

[70]  The lithography process is carried out in the same manner as Comparative Example 1 using the above-described amine contamination-protecting top-coating composition to produce the 150 nm pattern depicted in Figure 14.

[71]  Compared to Figure 1, the upper portion of the pattern in Figure 14 is significantly less damaged and shows a significantly improved vertical profile.

INVENTION EXAMPLE 13

[72]  A novel amine contamination-protecting top-coating composition of the present invention is prepared by blending 200 g of NFC 540 (a top-coating material manufactured by JSR) and 0.13 g of 2-aminobutyric acid.

[73]  The lithography process is carried out in the same manner as Comparative Example 1 using the above-described amine contamination-protecting top-coating composition to produce the 150 nm pattern depicted in Figure 15.

[74]  Compared to Figure 1, the upper portion of the pattern in Figure 15 is significantly less damaged and shows a significantly improved vertical profile.

INVENTION EXAMPLE 14

[75]  A novel amine contamination-protecting top-coating composition of the present invention is prepared by blending 200 g of NFC 540 (a top-coating material manufactured by JSR) and 0.108 g of alanine.

[76]  The lithography process is carried out in the same manner as Comparative Example 1 using the above-described amine contamination-protecting top-coating composition to produce the 150 nm pattern depicted in Figure 16.

[77]  Compared to Figure 1, the upper portion of the pattern in Figure 16 is significantly less damaged and shows a significantly improved vertical profile.

UNITED STATES PATENT AND TRADEMARK OFFICE
CERTIFICATE OF CORRECTION

| | |
|---|---|
| PATENT NO. | : 6,984,482 B2 |
| APPLICATION NO. | : 10/174497 |
| DATED | : January 10, 2006 |
| INVENTOR(S) | : Jung et al. |

It is certified that error appears in the above-identified patent and that said Letters Patent is hereby corrected as shown below:

Column 1, line 9, through column 7, line 9 (cont'd)

INVENTION EXAMPLE 15

[78]   A novel amine contamination-protecting top-coating composition of the present invention is prepared by blending 200 g of NFC 540 (a top-coating material manufactured by JSR) and 0.162 g of aspartic acid.

[79]   The lithography process is carried out in the same manner as Comparative Example 1 using the above-described amine contamination-protecting top-coating composition to produce the 150 nm pattern depicted in Figure 17.

[80]   Compared to Figure 1, the upper portion of the pattern in Figure 17 is significantly less damaged and shows a significantly improved vertical profile.

INVENTION EXAMPLE 16

[81]   A novel amine contamination-protecting top-coating composition of the present invention is prepared by blending 200 g of NFC 540 (a top-coating material manufactured by JSR) and 0.147 g of cysteine.

[82]   The lithography process is carried out in the same manner as Comparative Example 1 using the above-described amine contamination-protecting top-coating composition to produce the 150 nm pattern depicted in Figure 18.

[83]   Compared to Figure 1, the upper portion of the pattern in Figure 18 is significantly less damaged and shows a significantly improved vertical profile.

INVENTION EXAMPLE 17

[84]   A novel amine contamination-protecting top-coating composition of the present invention is prepared by blending 200 g of NFC 540 (a top-coating material manufactured by JSR) and 0.18 g of glutamine.

UNITED STATES PATENT AND TRADEMARK OFFICE
CERTIFICATE OF CORRECTION

PATENT NO. : 6,984,482 B2
APPLICATION NO. : 10/174497
DATED : January 10, 2006
INVENTOR(S) : Jung et al.

It is certified that error appears in the above-identified patent and that said Letters Patent is hereby corrected as shown below:

Column 1, line 9, through column 7, line 9 (cont'd)

[85] The lithography process is carried out in the same manner as Comparative Example 1 using the above-described amine contamination-protecting top-coating composition to produce the 150 nm pattern depicted in Figure 19.

[86] Compared to Figure 1, the upper portion of the pattern in Figure 19 is significantly less damaged and shows a significantly improved vertical profile.

INVENTION EXAMPLE 18

[87] A novel amine contamination-protecting top-coating composition of the present invention is prepared by blending 200 g of NFC 540 (a top-coating material manufactured by JSR) and 0.128 g of serine.

[88] The lithography process is carried out in the same manner as Comparative Example 1 using the above-described amine contamination-protecting top-coating composition to produce the 150 nm pattern depicted in Figure 20.

[89] Compared to Figure 1, the upper portion of the pattern in Figure 20 is significantly less damaged and shows a significantly improved vertical profile.

[90] While Invention Examples 1-18 describe using ArF radiation as the exposure light source, other light sources, including the ultrashort wavelength light sources such as KrF (248nm), $F_2$(157nm), E-beam, ion beam and extremely ultraviolet (EUV), can also be employed.

[91] In addition to the above-described PR composition, other conventional PR compositions known to one of ordinary skill in the art can also be used. Lithography conditions used in the Examples may vary, if necessary.

[92] The results obtained from the above Examples show that amine contamination during PED and pattern deformation on the top surface of the PR layer because of acid diffusion can be significantly reduced or prevented by adding an amine contamination-protecting compound to a conventional top-coating composition in accordance with the present invention.

UNITED STATES PATENT AND TRADEMARK OFFICE
CERTIFICATE OF CORRECTION

| | |
|---|---|
| PATENT NO. | : 6,984,482 B2 |
| APPLICATION NO. | : 10/174497 |
| DATED | : January 10, 2006 |
| INVENTOR(S) | : Jung et al. |

It is certified that error appears in the above-identified patent and that said Letters Patent is hereby corrected as shown below:

Column 1, line 9, through column 7, line 9 (cont'd)

[93]     The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, *e.g.*, as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed; whether or not such alternate, interchangeable and/or equivalent structures, functions, ranges or steps are disclosed herein, and without intending to publicly dedicate any patentable subject matter.--

Signed and Sealed this

Eighteenth Day of September, 2007

JON W. DUDAS
*Director of the United States Patent and Trademark Office*